United States Patent [19]
Kepler et al.

[11] Patent Number: 6,100,145
[45] Date of Patent: Aug. 8, 2000

[54] SILICIDATION WITH SILICON BUFFER LAYER AND SILICON SPACERS

[75] Inventors: Nick Kepler, Saratoga, Calif.; Karsten Wieczorek, Reichenberg-Boxdorf, Germany; Larry Wang, San Jose; Paul Raymond Besser, Sunnyvale, both of Calif.

[73] Assignee: Advanced Micro Devices, Inc., Sunnyvale, Calif.

[21] Appl. No.: 09/186,073

[22] Filed: Nov. 5, 1998

[51] Int. Cl.[7] .................................................. H01L 21/28
[52] U.S. Cl. .......................... 438/300; 438/301; 438/655; 438/682
[58] Field of Search .................................. 438/300, 301, 438/682, 655

[56] References Cited

U.S. PATENT DOCUMENTS

| | | |
|---|---|---|
| 5,824,586 | 10/1998 | Wollensen et al. . |
| 5,970,352 | 10/1999 | Shiozawa et al. . |
| 5,998,849 | 12/1999 | Ishimura et al. . |
| 6,015,753 | 6/1998 | Lin et al. . |

FOREIGN PATENT DOCUMENTS 8-288241  1/1996  Japan .

OTHER PUBLICATIONS

Xin–Ping Qu et al "The effect of amorphous Si on the epitaxial growth of CoSi2 by Co/Si/Ti/Si silid state epitaxy," IEEE, pp. 264–267, Sep. 1998.

Materials and Bulk Processes, "Doping Technologies," The National Technology Roadmap for Semiconductors (1994), pp. 118–121.

H. Jiang, et al., "Ultra Shallow Junction Formation Using Diffusion form Silicides," J. Electrochem. Soc., vol. 139, No. 1, Jan. 1992, pp. 196–218.

*Primary Examiner*—John F. Niebling
*Assistant Examiner*—Jonathan Hack

[57] ABSTRACT

High integrity ultra-shallow source/drain junctions are formed employing cobalt silicide contacts. Field oxide regions, gates, spacers, and source/drain implants are initially formed. A layer of silicon is then deposited. A protective non-contuctive film is then formed and anisotropically etched to expose the silicon layer on the source/drain regions and the top surfaces of the gates, and to form protective spacers on the edges of the field oxide regions and on the side surfaces of the gates. A layer of cobalt is thereafter deposited and silicidation is performed, as by rapid thermal annealing, to form a low-resistance cobalt silicide while consuming the silicon film. The consumption of the silicon film during silicidation results in less consumption of substrate silicon, thereby enabling the formation of ultra-shallow source/drain junctions without junction leakage, allowing the formation of cobalt silicide contacts at optimum thickness and facilitating reliable device scaling.

16 Claims, 5 Drawing Sheets

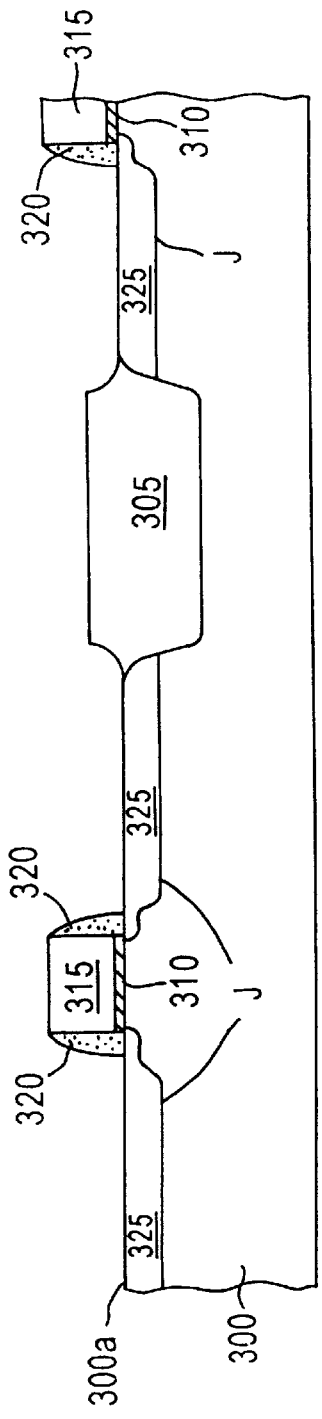
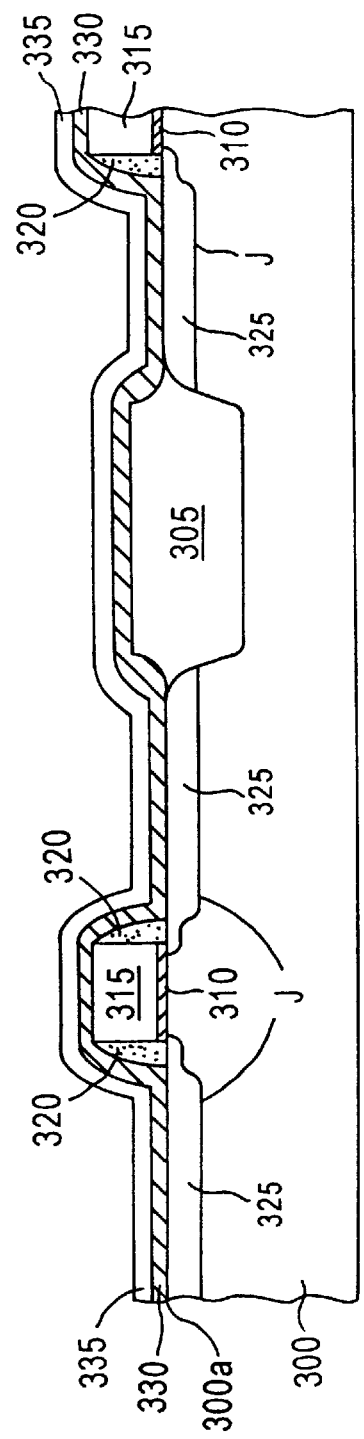
Figure 3A
Figure 3B

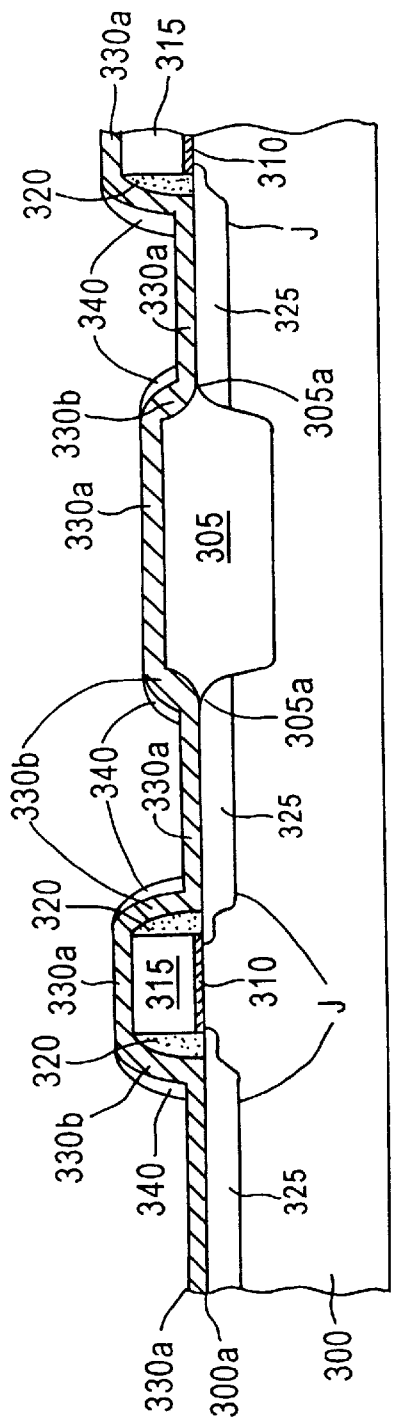
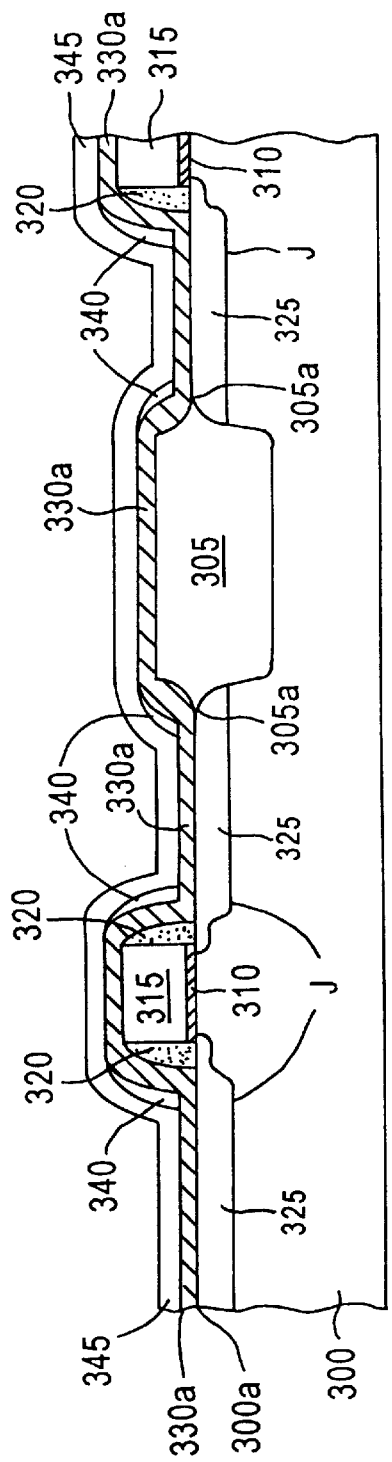

SILICIDATION WITH SILICON BUFFER LAYER AND SILICON SPACERS

RELATED APPLICATIONS

This application contains subject matter related to subject matter disclosed in copending U.S. patent application Ser. No 09/318,824, filed May 26, 1999.

FIELD OF THE INVENTION

The present invention relates to a method of manufacturing a semiconductor device comprising refractory metal silicide contacts to source/drain and silicon gate regions. The present invention has particular applicability in manufacturing reliable high density semiconductor devices with submicron design features, shallow junction depths and cobalt silicide contacts to source/drain regions.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

In the manufacture of conventional complementary metal oxide semiconductor (CMOS) devices, referring to FIG. 1A, isolation regions 110, called field oxide regions, are formed in a semiconductor substrate 100 of silicon dioxide by local oxidation of silicon (LOCOS) or by shallow trench isolation (STI). A conductive gate 130, such as polysilicon, is also formed on substrate 100, with a gate oxide layer 120 in between. Dielectric spacers 140 are formed on sidewalls of the gate 130, and source/drain regions 150 are formed on either side of gate 130 by implantation of impurities.

As gate lengths are reduced below 0.5 $\mu$m, refractory metal silicide layers, such as titanium silicide, are typically formed over source/drain regions 150 and gate 130 to reduce the sheet resistance of these components, thereby improving device performance. Referring to FIG. 1B, a titanium layer 160 is deposited, as by sputtering, over the entire substrate 100 as well as field oxide 110, gate 130 and spacers 140. A low temperature rapid thermal anneal (RTA) reaction creates a first-phase titanium silicide ($TiSi_2$—C49) on the exposed silicon of gate 130 and source/drain regions 150. The unreacted titanium over field oxide 110 and spacers 140 is then removed, and a high temperature RTA reaction changes the first-phase titanium silicide into a low-resistance second-phase titanium silicide 170 ($TiSi_2$—C54), as shown in FIG. 1C. Since the titanium silicide does not form on field oxide 110 or spacers 140, it is self-aligned to the gate 130 and source/drain regions 150. Hence, the titanium silicide formed in this process is known as "titanium salicide" (self-aligned silicide).

Titanium salicide is effective in decreasing sheet resistance if the gate width is greater than about 0.251 $\mu$m. At a gate width of about 0.25 $\mu$m the titanium silicide sheet resistance rises dramatically due to narrow-line effects; that is, the low-resistance silicide $TiSi_2$—C54 does not completely form because first-phase $TiSi_2$—C49 grains are very large (about 0.5 $\mu$m), and hence there are fewer nucleation sites on the gate to nucleate the low resistance silicide $TiSi_2$—C54 during the high temperature RTA.

To maintain low sheet resistance as gate widths are decreased in scale below about 0.25 $\mu$m, cobalt is typically used instead of titanium in silicide formation. Cobalt silicide does not display the undesirable narrow-line effects of titanium silicide because the conversion from its first-phase (CoSi) to its low-resistance second-phase ($CoSi_2$) is a diffusion reaction, rather than the nucleation and growth reaction of titanium silicide, and therefore the relationship of grain size to gate size is not a limiting factor.

However, the cobalt salicide process has a drawback in that cobalt silicide is more likely than titanium silicide to cause source and drain junction leakage, which can result in unacceptably high power dissipation as well as functional failure. This problem becomes especially critical as gate widths are scaled below 0.25 $\mu$m, and source and drain junctions are typically made shallower to prevent transistor short-channel effects. Since shallow junctions are more susceptible to junction leakage than deep junctions, cobalt silicide related junction leakage effectively limits CMOS device scaling.

Referring to FIG. 2, a cause of this junction leakage is the unevenness of the interface between the cobalt silicide 210 and the silicon source/drain regions 220, which results in an insufficient distance between portions of the bottom of the cobalt silicide 210 and source/drain junctions 220a. When a junction 220a is biased, a depletion region (i.e., an area depleted of free carriers) is formed which extends on either side of the junction 220a. Since the distance the depletion region spreads from the junction 220a is inversely proportional to the doping of the region, and source/drain region 220 is more heavily doped than substrate 200, the depletion region spreads mainly into substrate 200. Nevertheless, if cobalt silicide 210 extends into the depletion region, leakage can occur as carriers are swept across this highly charged region.

Junction leakage also occurs due to consumption of substrate silicon during silicide formation. For example, when cobalt silicide is formed to a given thickness, an amount of substrate silicon almost as great as the thickness of the silicide is consumed. As junctions become shallower with device scaling, consumption of substrate silicon during silicidation results in an insufficient distance between portions of the bottom of the cobalt silicide 210 and source/drain junctions 220a and, hence, junction leakage. Junction integrity can be maintained by providing a large enough distance between junction 220a and the interface of silicide 210 and source/drain region 220; i.e., by reducing the thickness of cobalt silicide 210. However, reducing its thickness increases the sheet resistance of cobalt silicide 210, thus reducing its effectiveness. Alternatively, junction leakage can be avoided by forming deeper source/drain regions. However, this is not desirable as it leads to reduced device performance.

There exists a need for a method of manufacturing a semiconductor device with ultra-shallow source/drain junctions and a low-resistance refractory metal silicide layer over its source/drain regions which does not cause junction leakage.

SUMMARY OF THE INVENTION

An advantage of the present invention is a method of manufacturing a semiconductor device having a metal silicide layer over its source/drain regions which does not adversely affect junction integrity.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming conductive gates and dielectric field oxide regions on a main surface of a semiconductor substrate; implanting impurities into the substrate to form source/drain regions having a junction with the substrate; forming a silicon layer on the source/drain regions, field oxide regions, and side and top surfaces of the gates; forming a protective non-conductive layer on the silicon layer; anisotropically etching the protective non-conductive layer to expose the silicon layer on the source/drain regions and the top surfaces of the gates and to form protective spacers on the silicon layer on the side surfaces of the gates and on field oxide edges where the field oxide regions abut the main surface; forming a metal layer on the exposed silicon layer; and heating to form a metal silicide layer from the metal layer and the exposed silicon layer; wherein the metal silicide layer is formed above the junction and is spaced apart from the junction.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 3A–3F schematically illustrate sequential phases of a method in accordance with an embodiment of the present invention.

DESCRIPTION OF THE INVENTION

The present invention addresses and solves problems stemming from conventional methods of forming low resistance cobalt silicide contacts on source/drain regions, particularly source/drain regions having ultra-shallow junction depths such as about 2000 Å and under; e.g., 500 Å and under. Such conventional cobalt silicide methodology consumes a significant thickness of substrate silicon during silicide formation, and results in a less than optimal distance between the cobalt silicide and the shallow source/drain junctions, thus causing junction leakage and preventing cost-effective device scaling. Furthermore, because conventional cobalt silicidation techniques tend to result in the formation of cobalt silicide in close proximity to shallow source/drain junctions, its thickness cannot be substantially increased to reduce its sheet resistance. In other words, conventional methodology effectively limits cobalt silicide thickness, thereby preventing desired improvement of the cobalt silicide's electrical characteristics.

According to the methodology of the present invention, a buffer layer of silicon is blanket deposited on a substrate after forming the source/drain implants, i.e., on source/drain regions and also on field oxide regions, gates and spacers. As used throughout the present disclosure and claims, the term "substrate" denotes a semiconductor substrate or an epitaxial layer formed on the semiconductor substrate. A protective non-conductive film is then deposited on the buffer silicon layer, and anisotropically etched to expose the buffer silicon layer on the source/drain regions and the top surfaces of the gates, while the protective non-conductive film on the spacers and on the edges of the field oxide regions remains to form self-aligned protective spacers. A blanket layer of cobalt is thereafter deposited and silicidation is performed, consuming the exposed buffer silicon layer to form the metal silicide contacts on the source/drain regions and the top surfaces of the gates, while the cobalt on the protective spacers does not react to form cobalt silicide, and is thereafter removed. The protective spacers prevent the formation of cobalt silicide where it is not needed, thereby avoiding short circuits. Furthermore, since silicon from the buffer silicon layer is consumed during silicidation, less substrate silicon is so consumed, enabling the formation of shallower junctions and thicker cobalt silicide contacts.

Figure 1A:
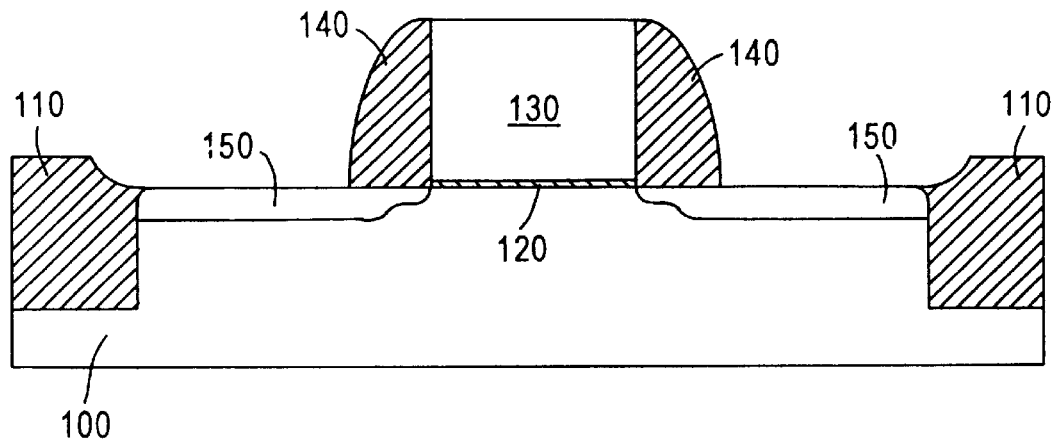
FIGS. 1A–1C schematically illustrate sequential phases of a conventional salicide technique.
Figure 1B:
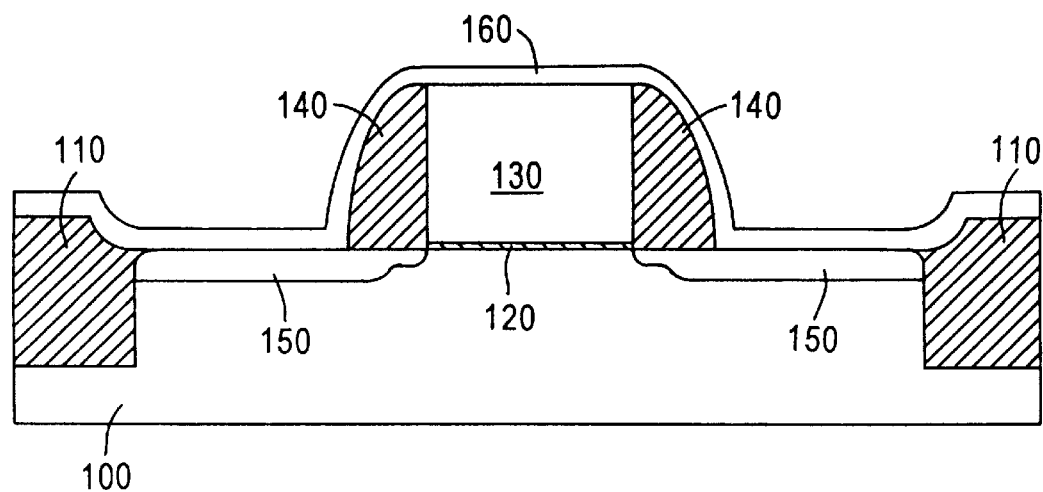
Figure 1C:
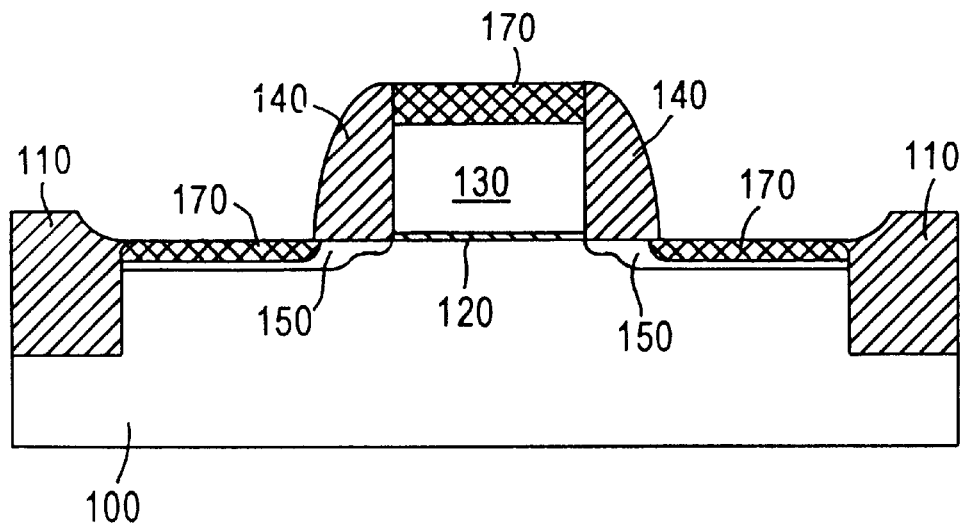
Figure 2:
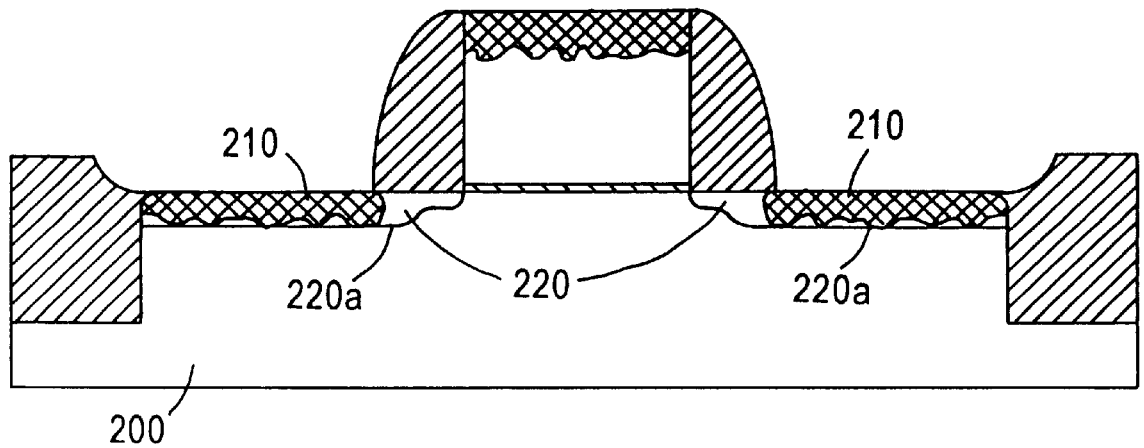
FIG. 2 depicts the results of a conventional method of cobalt salicide formation.
Figure 3E:
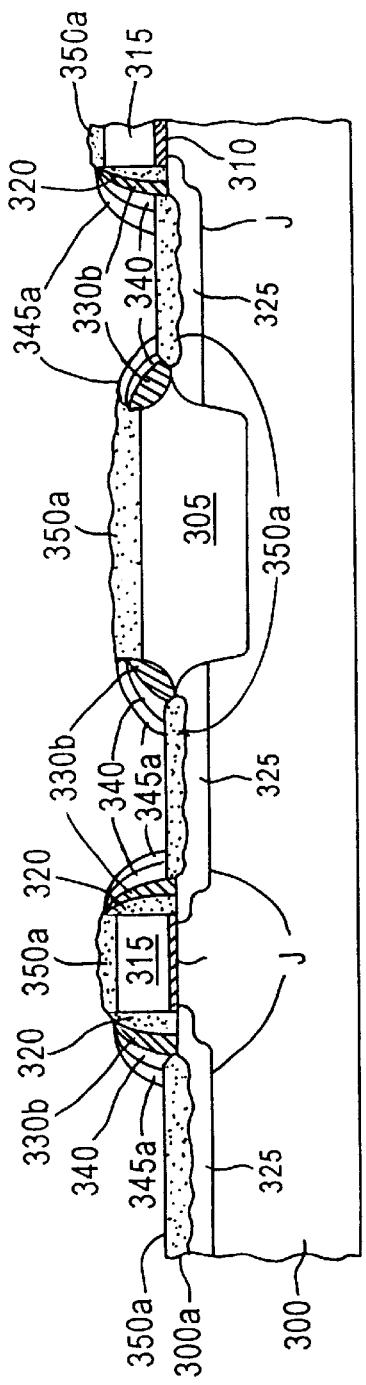
Figure 3F:
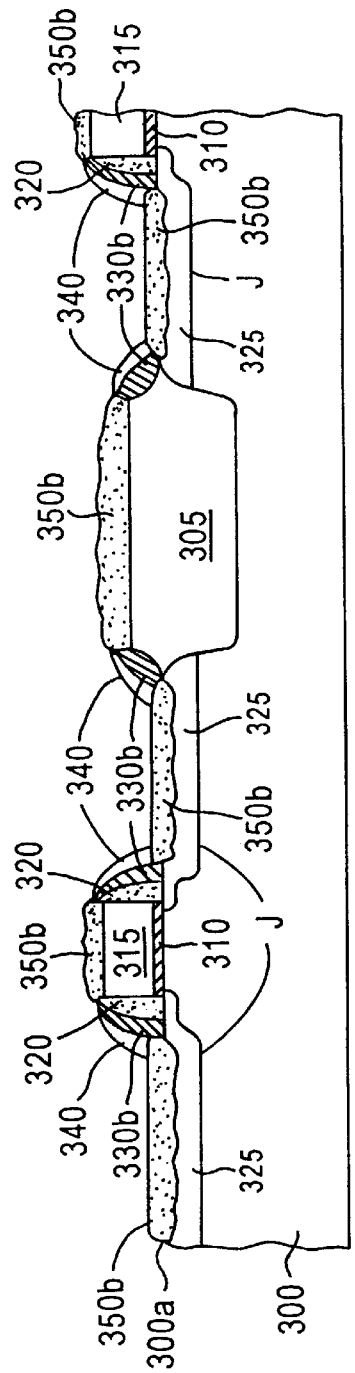

An embodiment of the present invention is illustrated in FIGS. 3A–3F. As shown in FIG. 3A, field oxide regions 305 are formed on a main surface 300a of substrate 300, as by LOCOS or STI, followed by a thermally grown gate oxide layer 310 and a polysilicon gate 315, typically deposited by low pressure chemical vapor deposition (LPCVD), masked and etched. Dielectric spacers 320 are thereafter formed on sidewalls of gate 315, such as silicon dioxide deposited by LPCVD and anisotropically etched. Impurities are then implanted into substrate 300, as by ion implantation, to form source/drain regions 325 having junctions J with substrate 300.

Referring to FIG. 3B, an undoped layer of silicon 330 is deposited across substrate 300, including field oxide regions 305, dielectric spacers 320 and gates 315, as by sputtering to form a layer of amorphous silicon or as by LPCVD to form a layer of polysilicon. Immediately following deposition of undoped silicon layer 330, a protective non-conductive layer 335 is deposited on silicon layer 330, such as silicon dioxide by plasma enhanced chemical vapor deposition (PECVD) or silicon nitride, to a thickness of about 100 Å to about 1000 Å.

Protective non-conductive layer 335 is then anisotropically etched, as by dry plasma etching, to expose portions 330a of silicon layer 330 on source/drain regions 325 and gates 315, and to form protective spacers 340 on portions 330b of silicon layer 330 over dielectric spacers 320 and over edges 305a of field oxide regions 305 where field oxide regions 305 abut main surface 300a (see FIG. 3C).

Next, referring to FIG. 3D, a layer of cobalt 345 is formed, as by sputtering, on the exposed portions 330a of silicon layer 330 and on protective spacers 340, and a low temperature RTA is performed at about 400° C. to about 550° C.; e.g., about 470° C., to cause portions of cobalt layer 345 to react with exposed portions 330a of silicon layer 330 and form a first-phase CoSi 350a (see FIG. 3E). Since CoSi layer 350a is formed from silicon layer 330, silicon of substrate 300 is not consumed in the reaction, and CoSi layer 350a is spaced an adequate distance from junction J to prevent junction leakage.

Protective spacers 340 are self-aligned by the anisotropic etch to areas where cobalt silicide 350a is not to be formed.

In the absence of protective spacers 340, cobalt silicide 350a would form a continuous sheet out of silicon layer 330, causing short-circuiting between gates 315 and source/drain regions 325. Since portions 345a of cobalt layer 345 above protective spacers 340 do not react to form a silicide, CoSi 350a is self-aligned to gate 315 and source/drain regions 325 of substrate 300.

Thereafter, unreacted portions 345a of cobalt layer 345 are stripped away, as by wet etching, such as a $H_2SO_4:H_2O_2:H_2O$ mix at a 5:1:1 ratio. A high-temperature RTA is then performed at about 700° C. to about 900° C.; e.g., about 825° C., to convert CoSi 350a into a second-phase low-resistance cobalt silicide.

The thickness of silicon layer 330 is determined by the desired final thickness of $CoSi_2$ 350b, which is, in turn, dependent on the thickness of cobalt layer 345. All of silicon layer 330 above gates 315 and source/drain regions 325 must be consumed to obtain the lowest possible sheet resistance for $CoSi_2$ 350b. At the same time, it is preferred to consume as little as possible of the silicon of substrate 300 during silicide formation. For example, if cobalt layer 345 is deposited to a thickness of about 100 Å to about 200 Å, silicon layer 330 should be deposited to a thickness of about 300 Å to about 600 Å. In conventional cobalt silicidation methodology, a cobalt layer about 100 Å thick will react with about 360 Å thickness of silicon to produce a cobalt silicide layer of about 350 Å. When practicing the present invention, it is preferred to deposit cobalt layer 345 to about 100 Å and silicon layer 330 to about 300 Å to produce a cobalt silicide layer 350b of about 350 Å. Silicon layer 330 is deposited to only 300 Å; i.e., less than the required 360 Å, to ensure complete consumption of silicon layer 330.

The methodology of the present invention enables formation of shallow source/drain regions having ultra-shallow junctions of high integrity with cobalt silicide contacts of optimized thickness thereon. By providing a silicon layer prior to depositing the cobalt layer, consumption of substrate silicon is reduced during silicide formation, enabling the formation of junctions of reduced depth vis-a-vis conventional methodology while avoiding junction leakage. Unlike conventional practices, the present invention enables cobalt silcide formation which is sufficiently spaced apart from ultra-shallow source/drain junctions to avoid junction leakage, regardless of the shape of the cobalt silicide/silicon interface or the thickness of the cobalt silicide layer. Thus, the present methodology enables the formation of thicker cobalt silicide layers with improved electrical characteristics, and facilitates device scaling by enabling the formation of low-resistance silicided source/drain regions having ultra-shallow junctions without silicide-related junction leakage. The present invention is applicable to the manufacture of various types of semiconductor devices having silicided source/drain regions, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming conductive gates and dielectric field oxide regions on a main surface of a semiconductor substrate;

implanting impurities into the substrate to form source/drain regions having a junction with the substrate;

forming a silicon layer on the source/drain regions, field oxide regions, and side and top surfaces of the gates;

forming a protective non-conductive layer on the silicon layer;

anisotropically etching the protective non-conductive layer to expose the silicon layer on the source/drain regions and the top surfaces of the gates and to form protective spacers on the silicon layer on the side surfaces of the gates and on field oxide edges where the field oxide regions abut the main surface;

forming a metal layer on the exposed silicon layer; and heating to form a metal silicide layer from the metal layer and the exposed silicon layer;

wherein the metal silicide layer is formed above the junction and is spaced apart from the junction.

2. The method according to claim 1, wherein the step of heating to form a metal silicide layer includes:

heating at a first temperature to form a first-phase metal silicide layer from the metal layer and the silicon layer; and heating at a second temperature to form a second-phase metal silicide layer having a resistivity lower than that of the first-phase metal silicide layer.

3. The method according to claim 2, wherein the metal layer comprises cobalt, the first-phase metal silicide layer comprises CoSi and the second-phase metal silicide layer comprises $CoSi_2$.

4. The method according to claim 3, wherein the step of heating at the first temperature includes rapid thermal annealing at about 400° C. to about 550° C.; and the step of heating at the second temperature includes rapid thermal annealing at about 700° C. to about 900° C.

5. The method according to claim 3, wherein the step of heating at the first temperature includes rapid thermal annealing at about 470° C., and the step of heating at the second temperature includes rapid thermal annealing at about 825° C.

6. The method according to claim 2, comprising heating at the first temperature for an amount of time sufficient to substantially consume the silicon layer when forming the first-phase metal silicide layer.

7. The method according to claim 3, comprising depositing the metal layer at a thickness of about 100 Å to about 200 Å and depositing the silicon layer at a thickness of about 300 Å to about 600 Å.

8. The method according to claim 3, comprising depositing the metal layer at a thickness of about 100 Å and depositing the silicon layer at a thickness of about 300 Å.

9. The method according to claim 1, comprising:

forming dielectric spacers on the side surfaces of the gates before forming the silicon layer; and forming the silicon layer, the protective non-conductive layer and the protective spacers on the dielectric spacers.

10. The method according to claim 3, comprising:

forming the metal layer on the protective spacers; and etching to remove the metal layer from the protective spacers after forming the first-phase metal silicide layer.

11. The method according to claim 1, wherein the step of forming the silicon layer comprises forming a polysilicon layer by LPCVD.

12. The method according to claim 1, wherein the step of forming the silicon layer comprises forming an amorphous silicon layer by sputtering.

13. The method according to claim 1, comprising forming the protective non-conductive layer to a thickness of about 100 Å to about 1000 Å.

14. The method according to claim 1, wherein the step of forming the protective non-conductive layer comprises forming a layer of silicon dioxide.

15. The method according to claim 14, comprising forming the silicon dioxide layer by PECVD.

16. The method according to claim 1, wherein the step of forming the protective non-conductive layer comprises forming a layer of silicon nitride.

* * * * *